(12) United States Patent
Liu et al.

(10) Patent No.: US 8,405,787 B2
(45) Date of Patent: Mar. 26, 2013

(54) PIXEL STRUCTURE OF A DISPLAY PANEL

(75) Inventors: Sheng-Chao Liu, Hsin-Chu (TW);
Hsiang-Lin Lin, Hsin-Chu (TW);
Kuang-Hsiang Liu, Hsin-Chu (TW);
Ching-Huan Lin, Hsin-Chu (TW);
Ming-Tien Lin, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 595 days.

(21) Appl. No.: 12/405,247

(22) Filed: Mar. 17, 2009

(65) Prior Publication Data
US 2010/0059758 A1   Mar. 11, 2010

(30) Foreign Application Priority Data

Sep. 5, 2008   (TW) .............................. 97134058 A

(51) Int. Cl.
G02F 1/1343   (2006.01)
(52) U.S. Cl. .......................................... 349/39; 349/38
(58) Field of Classification Search .................... 349/38, 349/39
See application file for complete search history.

(56) References Cited

U.S. PATENT DOCUMENTS

| | | | | |
|---|---|---|---|---|
| 5,182,620 A * | 1/1993 | Shimada et al. | ................. | 257/72 |
| 5,295,008 A * | 3/1994 | Mizobata et al. | ............... | 349/51 |
| 5,835,169 A | 11/1998 | Kwon | | |
| 6,172,728 B1 * | 1/2001 | Hiraishi | ........................ | 349/139 |
| 6,249,326 B1 | 6/2001 | Hebiguchi | | |
| 6,507,375 B1 * | 1/2003 | Kawahata | ........................ | 349/38 |
| 6,784,949 B1 | 8/2004 | Nagata | | |
| 7,554,119 B2 * | 6/2009 | Sawamizu et al. | ............... | 257/72 |
| 2002/0033809 A1 | 3/2002 | Nakajima | | |
| 2003/0174258 A1 | 9/2003 | Yun et al. | | |
| 2004/0080681 A1 * | 4/2004 | Moon | ............................. | 349/43 |
| 2004/0174483 A1 * | 9/2004 | Nakamura et al. | ............ | 349/139 |
| 2006/0226426 A1 * | 10/2006 | Park et al. | ........................ | 257/59 |
| 2006/0258034 A1 * | 11/2006 | Sohn | ............................. | 438/30 |
| 2007/0058096 A1 | 3/2007 | Tsai | | |
| 2007/0262316 A1 * | 11/2007 | Kim et al. | ........................ | 257/72 |
| 2009/0040408 A1 * | 2/2009 | Ishii | .............................. | 349/39 |

FOREIGN PATENT DOCUMENTS

| | | |
|---|---|---|
| CN | 1338719 A | 3/2002 |
| CN | 1445583 A | 10/2003 |
| JP | 2001021919 | 1/2001 |
| TW | I258626 | 7/2006 |
| TW | 200916928 | 4/2009 |

* cited by examiner

*Primary Examiner* — Uyen Chau N Le
*Assistant Examiner* — Chris Chu
(74) *Attorney, Agent, or Firm* — Winston Hsu; Scott Margo

(57) ABSTRACT

A tri-gate pixel structure includes three sub-pixel regions, three gate lines, a data line, three thin film transistors (TFTs), three pixel electrodes, and a common line. The gate lines are disposed along a first direction, and the data line is disposed along a second direction. The TFTs are disposed in the sub-pixel regions respectively, wherein each TFT has a gate electrode electrically connected to a corresponding gate line, a source electrode electrically connected to the data line, and a drain electrode. The three pixel electrodes are disposed in the three sub-pixel regions respectively, and each pixel electrode is electrically connected to the drain electrode of one TFT respectively. The common line crosses the gate lines and partially overlaps the three gate lines, and the common line and the three pixel electrodes are partially overlapped to respectively form three storage capacitors.

12 Claims, 7 Drawing Sheets

PIXEL STRUCTURE OF A DISPLAY PANEL

BACKGROUND OF THE INVENTION

1. Field of the Invention

The present invention relates to a pixel structure of a display panel, and more particularly, to a tri-gate pixel structure of a liquid crystal display panel having high aperture ratio.

2. Description of the Prior Art

The pixel structure of display panel, based on different driving modes, may be generally divided into two types including single-gate pixel structure; and tri-gate pixel structure. When displaying images with the same resolution, the number of gate lines of the display panel having the tri-gate pixel structure is three times greater than, and the number of data lines of the display panel having the tri-gate pixel structure is reduced to one-third of that of the display panel having the single-gate pixel structure. Hence, the display panel having the tri-gate pixel structure uses more gate drivers, but less source drivers. Since the cost and power consumption of the gate driver is less than that of the source driver, the tri-gate pixel structure design is beneficial for its low cost and low power consumption.

Notwithstanding its low cost and low power consumption, the conventional tri-gate pixel structure yet suffers from the difficulty in designing storage capacitor and low aperture ratio issue.

SUMMARY OF THE INVENTION

It is therefore one of the objectives of the present invention to provide a pixel structure of a display panel to improve aperture ratio.

According to the present invention, a tri-gate pixel structure is provided. The tri-gate pixel structure is formed on a substrate, and the substrate includes three sub-pixel regions. The tri-gate pixel structure includes three gate lines, a data line, three thin film transistors, three pixel electrodes and a common line. The gate lines are disposed along a first direction on the substrate. The data line is disposed along a second direction on the substrate. The thin film transistors are disposed on each of the sub-pixel regions respectively, and each of the thin film transistors includes a gate electrode, a source electrode and a drain electrode, wherein the gate electrode of each of the thin film transistors is electrically connected to the corresponding gate line, and the source electrode of each of the thin film transistors is electrically connected to the data line. The pixel electrodes are disposed in each of the sub-pixel regions respectively, and electrically connected to the corresponding drain electrode of each of the thin film transistors respectively. The common line, disposed on the substrate, crosses the gate lines, and partially overlaps with the gate lines. The common line and the pixel electrodes partially overlap, forming three storage capacitors respectively.

According to the present invention, a liquid crystal display panel is provided. The liquid crystal display panel includes a first substrate, a second substrate disposed opposite to the first substrate, and a liquid crystal layer interposed between the first substrate and the second substrate. The first substrate includes a plurality of pixel region, each pixel region includes three sub-pixel regions, and each pixel region comprises a pixel structure. The pixel structure includes three gate lines, a data line, three thin film transistors, three pixel electrodes and a common line. The gate lines are disposed along a first direction on the first substrate. The data line is disposed along a second direction on the first substrate. The thin film transistors are disposed on each of the sub-pixel regions respectively, and each of the thin film transistors includes a gate electrode, a source electrode and a drain electrode, wherein the gate electrode of each of the thin film transistors is electrically connected to the corresponding gate line, and the source electrode of each of the thin film transistors is electrically connected to the data line. The pixel electrodes are disposed in each of the sub-pixel regions respectively, and electrically connected to the corresponding drain electrode of each of the thin film transistors respectively. The common line, disposed on the first substrate, crosses the gate lines, and partially overlaps with the gate lines. The common line and the pixel electrodes partially overlap, forming three storage capacitors respectively.

According to the present invention, a pixel structure, or named a sub-pixel structure, of a display panel is provided. The pixel structure is formed on a substrate comprising a plurality of sub-pixel regions. The pixel structure includes a gate line, a data line, a thin film transistor, a pixel electrode and a common line. The gate line is disposed along a first direction on the substrate. The data line is disposed along a second direction on the substrate. The thin film transistor is disposed in the sub-pixel region, and the thin film transistor includes a gate electrode, a source electrode and a drain electrode, wherein the gate electrode of the thin film transistor is electrically connected to the gate line, and the source electrode of the thin film transistor is electrically connected to the data line. The pixel electrode is disposed in the sub-pixel region and electrically connected to the drain electrode of the thin film transistor. The common line, disposed on the substrate, partially overlaps with the gate line, wherein the common line and the pixel electrode partially overlap, forming a storage capacitor.

The common line of the pixel structure of the display panel in this embodiment may be disposed along a direction different from that of the gate line, hence, the common line may cross the gate line. In a tri-gate pixel structure, this design allows the common line penetrating the sub-pixel region along the short axis, instead of along the long axis of the sub-pixel region. As a result, the aperture ratio is improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in details. The preferred embodiments of the present invention are illustrated in the accompanying drawings with numbered elements.

Figure 1:
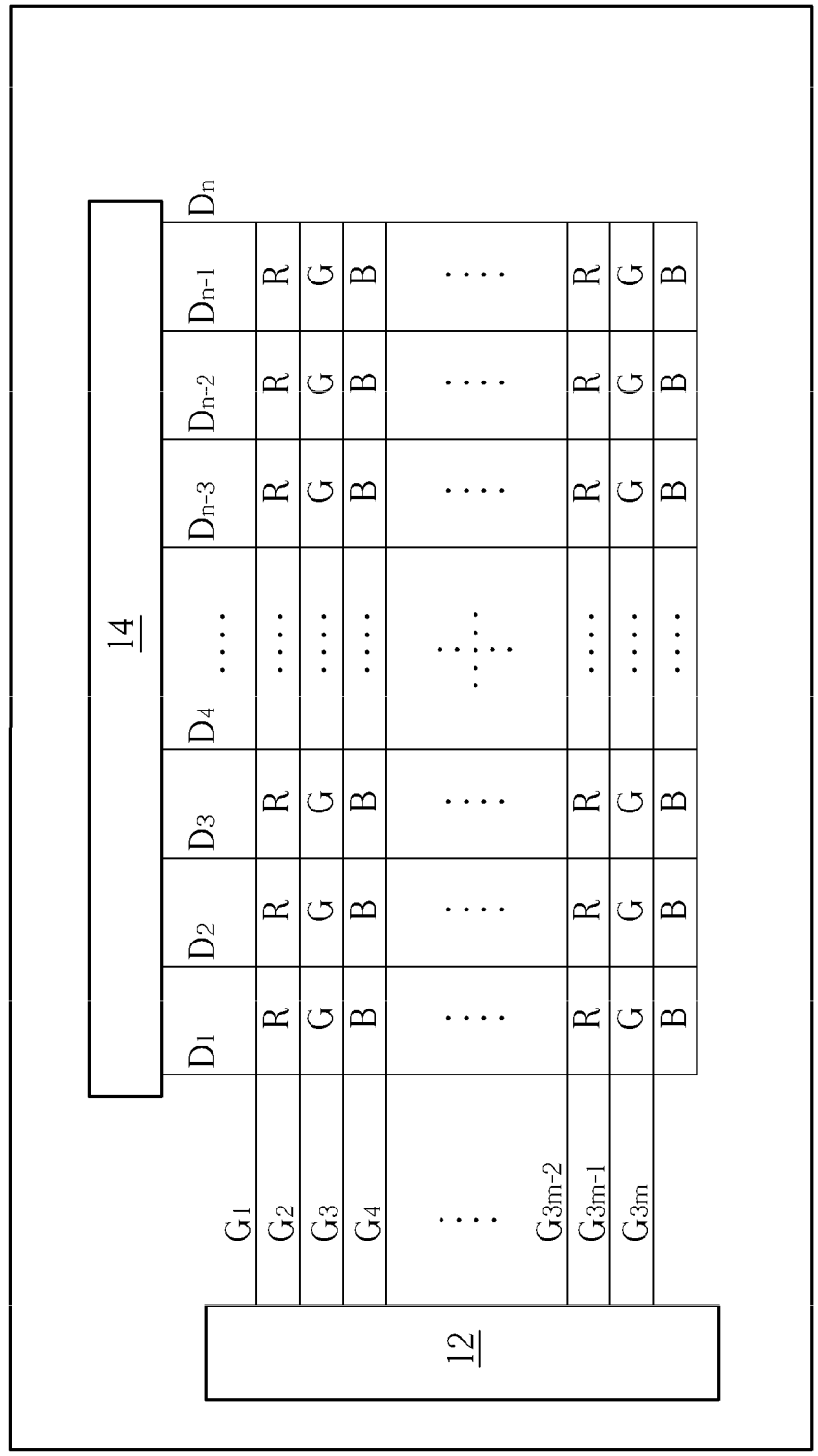
FIG. 1 illustrates a display panel having a tri-gate pixel structure according to a preferred embodiment of the present invention.

Refer to FIG. 1. FIG. 1 illustrates a display panel having a tri-gate pixel structure according to a preferred embodiment of the present invention. As shown in FIG. 1, a display panel having a tri-gate pixel structure 10 with a resolution of n*m includes m*3 gate lines (G1, G2, . . . , G3m), and n data line (D1, D2, . . . , Dn). The gate lines (G1, G2, . . . , G3m) are electrically connected to a gate driver module 12, and the data lines (D1, D2, . . . , Dn) are electrically connected to a source driver module 14.

When displaying images with the same resolution (e.g. n*m), the display panel having a tri-gate pixel structure 10 includes 3m gate lines and n data lines, while the display panel having a single-gate pixel structure includes m gate lines and 3n data lines. Hence, the tri-gate pixel structure, compared with the single-gate pixel structure, uses more gate drivers but less source drivers, which leads to reduction of cost and power consumption.

Figure 2:
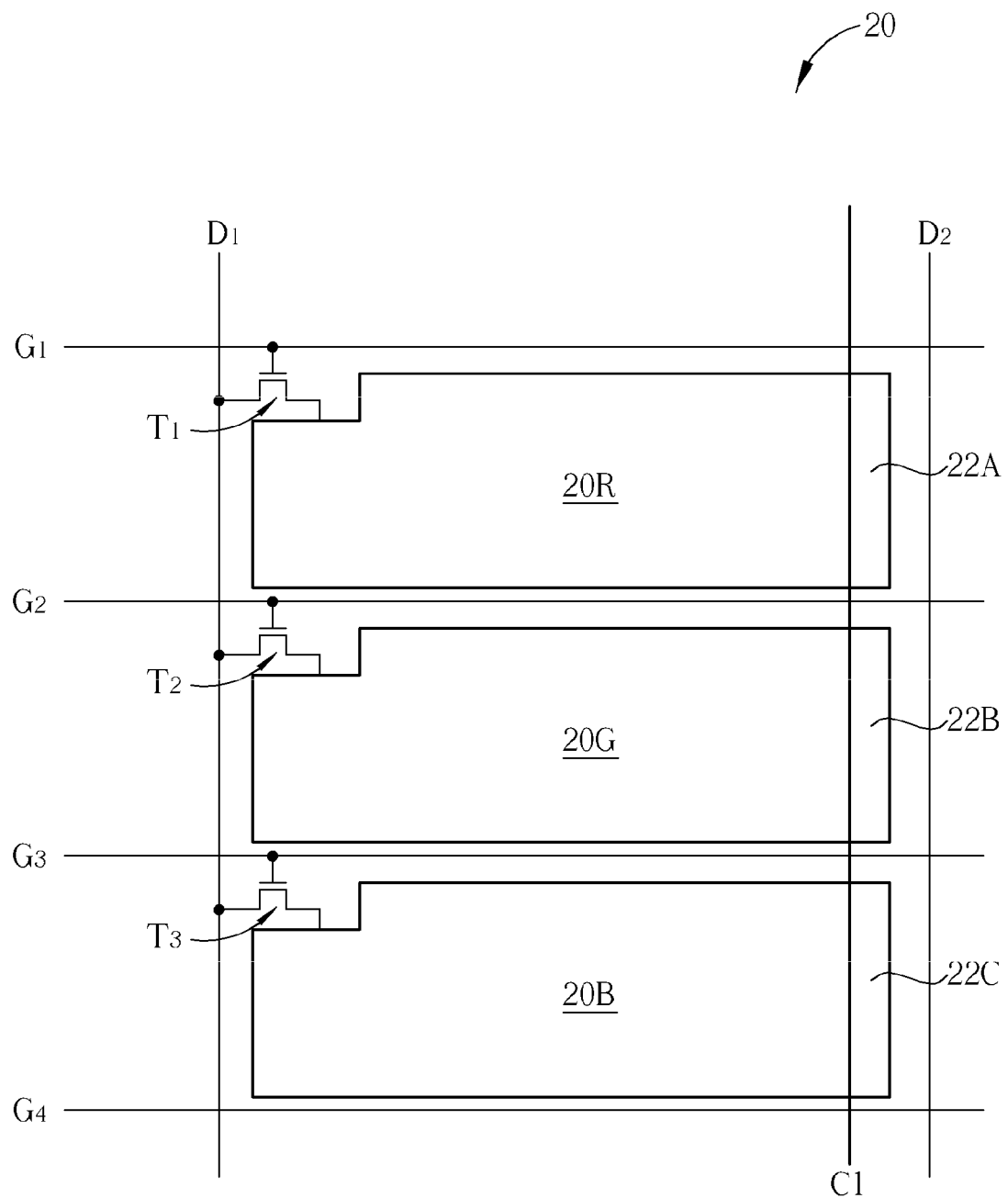
FIG. 2 illustrates a circuit diagram of the tri-gate pixel structure of the present invention.

Refer to FIG. 2. FIG. 2 illustrates a circuit diagram of the tri-gate pixel structure of the present invention. As shown in FIG. 2, the tri-gate pixel structure 20 includes three sub-pixel regions including a red sub-pixel region 20R, a green sub-pixel region 20G and a blue sub-pixel region 20B, three thin film transistors (TFTs) T1, T2, T3 disposed in the red sub-pixel region 20R, the green sub-pixel region 20G and the blue sub-pixel region 20B respectively, and three pixel electrodes 22A, 22B, 22C disposed in the red sub-pixel region 20R, the green sub-pixel region 20G and the blue sub-pixel region 20B respectively. The gate electrode of each of the TFTs T1, T2, T3 is electrically connected to the corresponding gate lines G1, G2, G3 respectively. The source electrode of each of the TFTs T1, T2, T3 is electrically connected to the data line D1. The drain electrode of each of the TFTs T1, T2, T3 is electrically connected to the pixel electrodes 22A, 22B, 22C respectively. Accordingly, the red sub-pixel region 20R, the green sub-pixel region 20G and the blue sub-pixel region 20B of the tri-gate pixel structure 20 are respectively controlled by the gate lines G1, G2, G3, and received the signals delivered by the same data line D1 at different time so as to display images of different grey scales. In addition, the gate lines G1, G2, G3 are arranged along a first direction, and the data line D1 is disposed along a second direction. The common line C1 crosses and partially overlaps with the gate lines G1, G2, G3, and the common line C1 and the pixel electrodes 22A, 22B, 22C partially overlap, forming three storage capacitors respectively.

Figure 3:
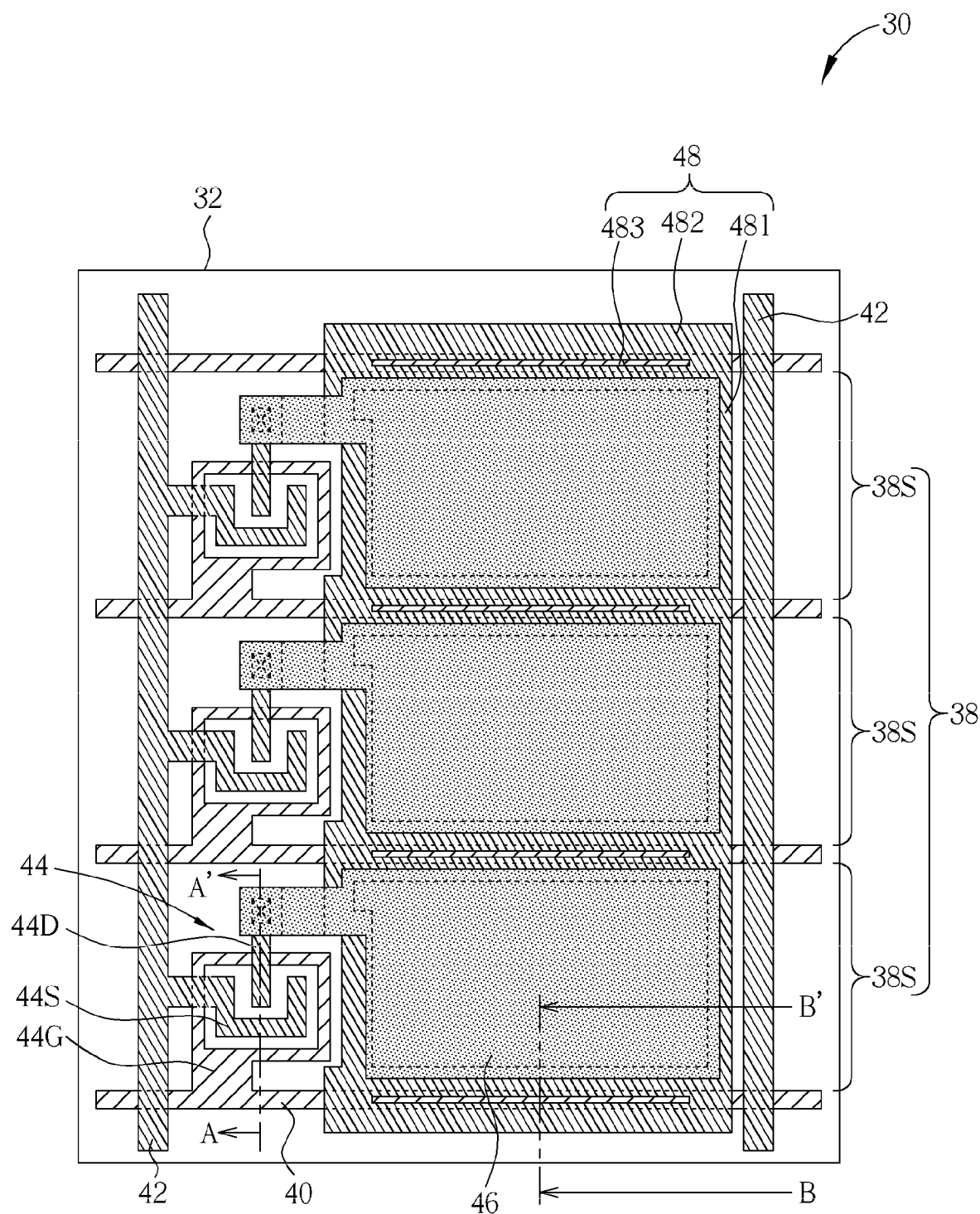
FIG. 3 and FIG. 4 are schematic diagrams of a pixel structure of a display panel according to a preferred embodiment of the present invention.
Figure 4:
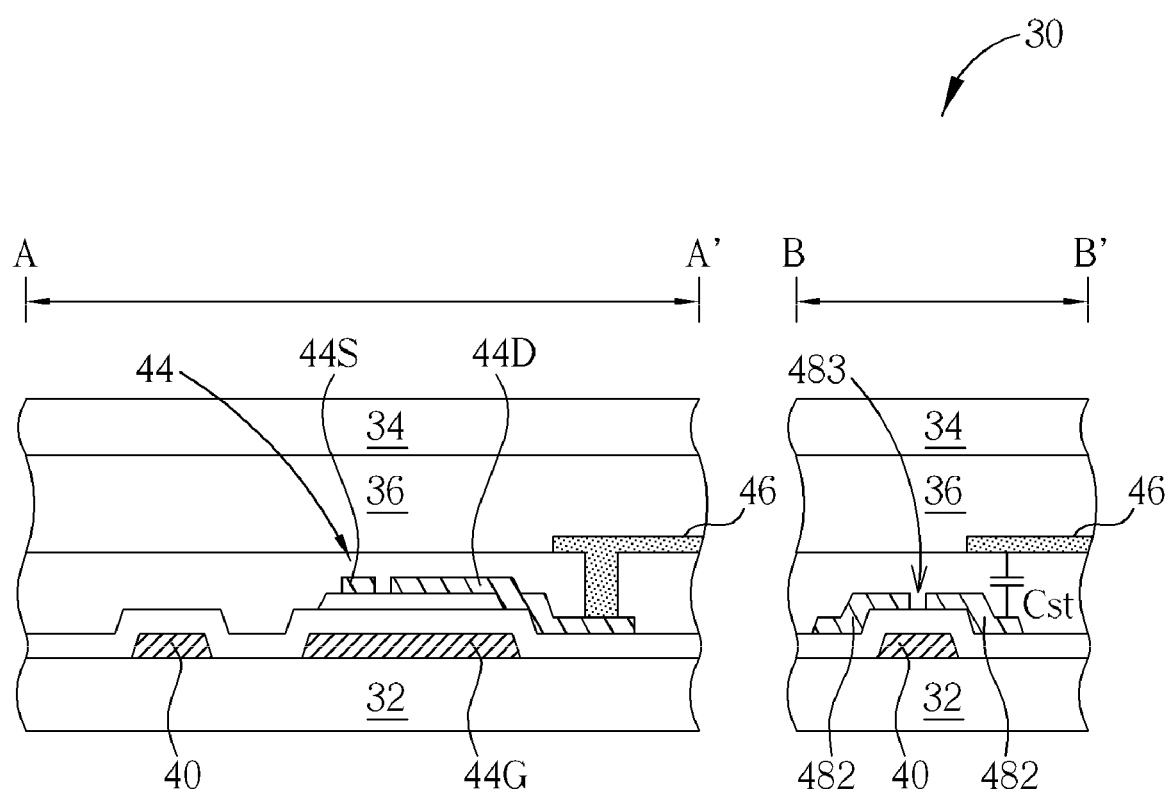

Refer to FIG. 3 and FIG. 4. FIG. 3 and FIG. 4 are schematic diagrams of a pixel structure of a display panel according to a preferred embodiment of the present invention, where FIG. 3 is a top view of the pixel structure, and FIG. 4 is a cross-sectional view of the pixel structure shown in FIG. 3 along the tangent lines A-A' and B-B'. In FIG. 3, the liquid crystal layer and the second substrate are omitted in order to emphasize the features of the present invention. In the embodiments to be illustrated, an LCD panel having a tri-gate pixel structure is exemplarily illustrated, but the pixel structure of the display panel of the present invention is not limited to be the pixel structure of an LCD panel. As shown in FIG. 3 and FIG. 4, the LCD panel 30 includes a first substrate (also referred to as array substrate or TFT substrate) 32, a second substrate (also referred to as color filter substrate) 34 disposed opposite to the first substrate 32, and a liquid crystal layer 36 interposed between the first substrate 32 and the second substrate 34. The first substrate 32 includes a plurality of pixel regions 38, and each pixel region 38 includes three sub-pixel regions 38S (e.g. red sub-pixel region, green sub-pixel region, and blue sub-pixel region). Each of the sub-pixel region 38S is a rectangular region but not limited, where the long axis is disposed along the first direction, and the short axis is disposed along the second direction substantially perpendicular to the first direction. Each of the pixel region 38 has a pixel structure including three gate lines 40, a data line 42, three TFTs 44, three pixel electrodes 46, and a common line 48. The gate lines 40 are disposed along the first direction on the first substrate 32, and the data line 42 is disposed along the second direction on the first substrate 32. The TFTs 44 are disposed respectively in each of the sub-pixel regions 38S, and each of the TFTs 44 includes a gate electrode 44G, a source electrode 44S, and a drain electrode 44D. Each gate electrode 44G is electrically connected to the corresponding gate line 40, each source electrode 44S is electrically connected to the data line 42, and each drain electrode 44D is electrically connected to the pixel electrode 46 of each sub-pixel region 38S. The common line 48, disposed on the first substrate 32, crosses and partially overlaps with the gate line 40, and also partially overlaps with the pixel electrodes 46 so as to form three storage capacitors Cst respectively.

In this embodiment, the common line 48 and the gate lines 40 are made of different conductive layers, hence, the common line 48 and the gate lines 40 may be disposed along different directions, and the common line 48 may cross the gate lines 40. For instance, the gate lines 40 extends along the long axis (the first direction) of the sub-pixel region 38S, but the common line 48 penetrates through the sub-pixel region 38S along the short axis (the second direction). Consequently, the area ratio of the common line 48 to the display region may be reduced, so as to decrease the light shielding area and improve the aperture ratio. The common line 48 and the data line 42 may be, for instance, made by the same conductive layer, but not limited. The common line 48 may also be made by another conductive layer different from the data line 42.

In this embodiment, the common line 48 includes a plurality of first common sections 481 and a plurality of second common extension parts 482. The first common section 481, which is disposed along the second direction, penetrates each of the sub-pixel regions 38S. The second common extension part 482, which is coupled to the first common section 481, extends along the first direction. In each of the sub-pixel regions 38S, two first common sections 481, and two second common extension parts 482 form a closed pattern substantially surrounding the periphery of the sub-pixel region 38S. In addition, the second common extension part 482 and the pixel electrode 46 partially overlap, and the overlapping region forms a storage capacitor Cst. Also, the second common extension part 482 may includes an opening pattern 483 e.g. a slit opening partially exposing the gate electrode 40 disposed thereunder, such that the parasitic capacitance between the common line 48 and the gate line 40 may be reduced.

Figure 5:
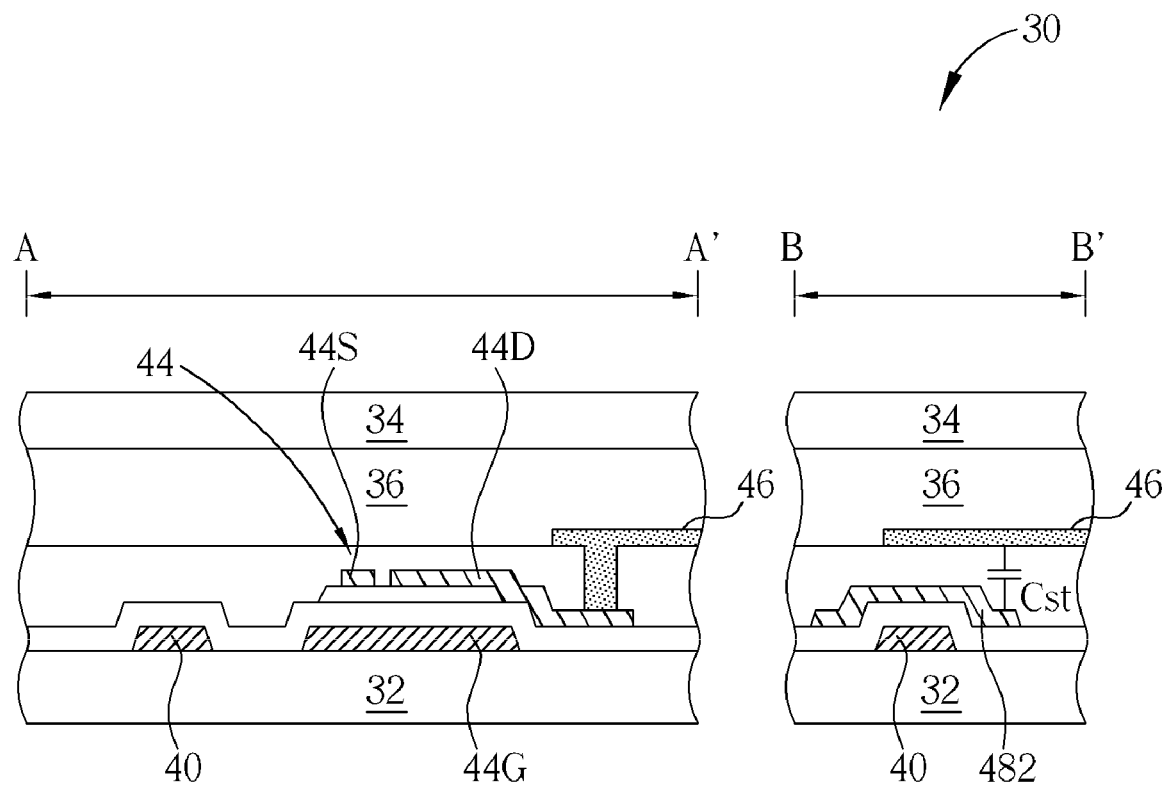
FIG. 5 schematically illustrates a cross-sectional view of the pixel structure of the display panel according to another embodiment of the present invention.

In the aforementioned embodiment, the pixel electrode 46 and the common line 48 partially overlap, but the pixel electrode 46 and the gate line 40 does not overlap. The pixel structure of the present invention, however, is not limited, and may have different configurations. Refer to FIG. 5. FIG. 5 schematically illustrates a cross-sectional view of the pixel structure of the display panel according to another embodiment of the present invention. As shown in FIG. 5, the pixel electrode 46, the common line 48 and the gate line 40 overlap with one another in this embodiment. Specifically, the pixel electrode 46 is extended to the top of the gate line 40, thereby overlapping with the gate line 40. The edge of the pixel electrode 46 and the edge of the gate line 40 are aligned as shown in FIG. 5, but not limited. Also, there is no opening pattern design in the overlapping region between the common line 48 and the gate line 40.

Figure 6:
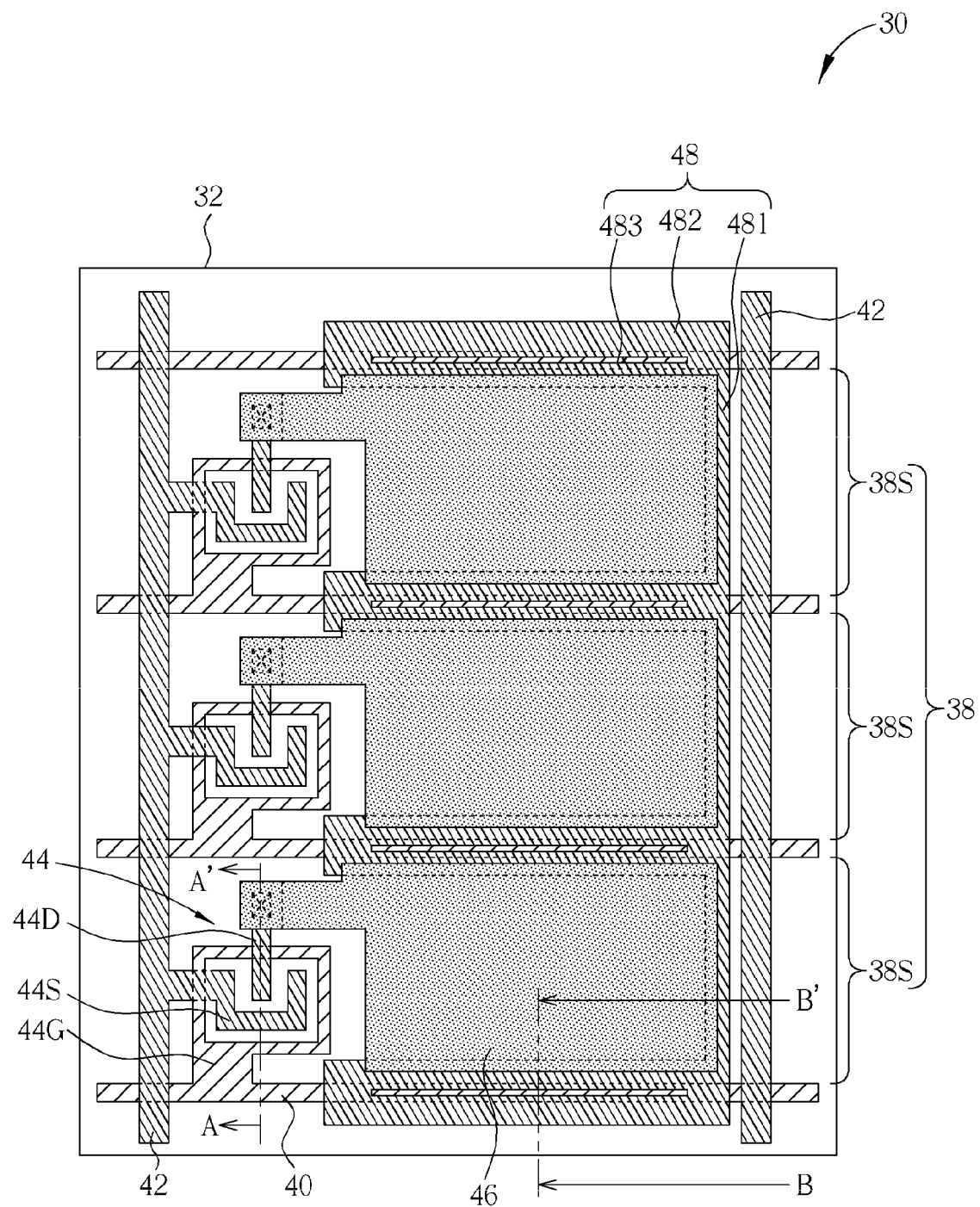
FIG. 6 and FIG. 7 schematically illustrate the pixel structure of the display panel according to two other embodiments of the present invention.
Figure 7:
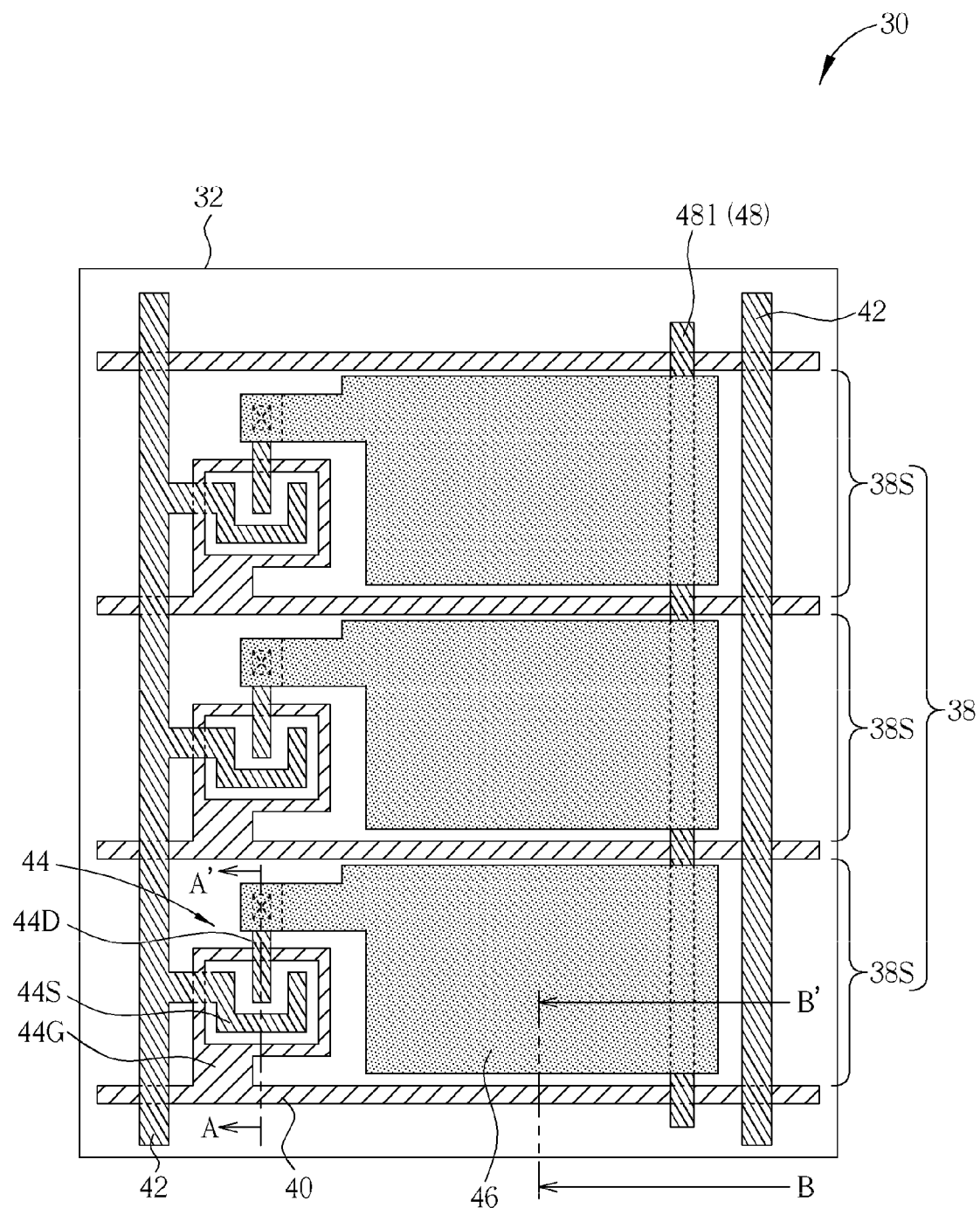

Refer to FIG. 6 and FIG. 7. FIG. 6 and FIG. 7 schematically illustrate the pixel structure of the display panel according to two other embodiments of the present invention. To highlight the differences between these embodiments and the aforementioned embodiment, only top views of the pixel structure are drawn, and identical elements are denoted by identical numerals without redundantly detailing. As shown in FIG. 6, the common line 48 of the pixel structure includes first common sections 481 and second common extension parts 482. The first common section 481, which is disposed along the second direction, penetrates through the sub-pixel region 38S, and the second common extension parts 482 are coupled to the first common section 481 and extended along the first direction. Different from the aforementioned embodiment, the common line 48 in each sub-pixel region 38S includes one first common section 481, and two second common extension parts 482 in this embodiment. The single first common section 481 and the two second common extension parts 482 form an open hoof-shaped pattern (or a U-shaped pattern), instead of a closed pattern. In addition, an opening pattern 483 may be selectively formed in the second common extension part 482 corresponding to the gate line 40, so as to reduce the parasitic capacitance between the common line 48 and the gate line 40. Also, the pixel electrode 46 and the common line 48 partially overlap, but the pixel electrode 46 and the gate line 40 may be overlapping or not based on different design considerations.

As shown in FIG. 7, the common line 48 includes only the first common sections 481 disposed along the second direction, and penetrating through the sub-pixel regions 38S. The first common section 481 and the pixel electrode 46 partially overlap, thereby forming a storage capacitor. In addition, the first common section 481 is not limited to penetrate through the sub-pixel region 38S in the periphery of the sub-pixel region 38S, and may penetrate through the sub-pixel region 38S e.g. in the middle of the sub-pixel region 38S.

In conclusion, the common line and the gate line are made of different conductive layers, and thus the common line and the gate line may be arranged along different directions, and the common line may cross the gate line. In a tri-gate pixel structure, this design allows the common line penetrating the sub-pixel region along the short axis, instead of along the long axis of the sub-pixel region. As a result, the aperture ratio is improved.

Those skilled in the art will readily observe that numerous modifications and alterations of the device and method may be made while retaining the teachings of the invention.

What is claimed is:

1. A tri-gate pixel structure formed on a substrate, the substrate comprising three sub-pixel regions, the tri-gate pixel structure comprising:
    three gate lines disposed along a first direction on the substrate;
    a data line disposed along a second direction on the substrate;
    three thin film transistors disposed on each of the sub-pixel regions respectively, each of the thin film transistors comprising a gate electrode, a source electrode and a drain electrode, wherein the gate electrode of each of the thin film transistors is electrically connected to the corresponding gate line, and the source electrode of each of the thin film transistors is electrically connected to the data line;
    three pixel electrodes disposed in each of the sub-pixel regions respectively, and electrically connected to the corresponding drain electrode of each of the thin film transistors respectively; and
    a common line disposed on the substrate, wherein the common line crosses the gate lines, partially overlaps with the gate lines, and the common line and the pixel electrodes partially overlap, forming three storage capacitors, respectively;
    wherein the common line comprises a first common section disposed along the second direction and a plurality of second common extension parts coupled to the first common section to form three closed patterns substantially surrounding the three sub-pixel regions, and the common line and the data line are made of a same conductive layer.

2. The tri-gate pixel structure of claim 1, wherein the common line and the gate lines are made of different conductive layers.

3. The tri-gate pixel structure of claim 1, wherein each of the sub-pixel regions comprises a rectangular region, and a long axis of the rectangular region is disposed along the first direction.

4. The tri-gate pixel structure of claim 1, wherein the second common extension part and the gate line partially are overlapped, and the second common extension part comprises an opening pattern partially exposing the gate line.

5. The tri-gate pixel structure of claim 1, wherein at least a part of the common line is disposed on the same surface with the source electrode, the drain electrode, or the data line.

6. The tri-gate pixel structure of claim 1, wherein the common line does not overlap the data line.

7. The tri-gate pixel structure of claim 1, wherein the common line and the data line are simultaneously formed by the same conductive layer.

8. A liquid crystal display panel, comprising:
    a first substrate comprising a plurality of pixel region, each pixel region comprising three sub-pixel regions, each pixel region comprising a pixel structure, the pixel structure comprising:
        three gate lines disposed along a first direction on the first substrate;
        a data line disposed along a second direction on the first substrate;
        three thin film transistors disposed on each of the sub-pixel regions respectively, each of the thin film transistors comprising a gate electrode, a source electrode and a drain electrode, wherein the gate electrode of each of the thin film transistors is electrically connected to the corresponding gate line, and the source electrode of each of the thin film transistors is electrically connected to the data line;
        three pixel electrodes disposed in each of the sub-pixel regions respectively, and electrically connected to the corresponding drain electrode of each of the thin film transistors respectively; and
        a common line disposed on the first substrate, wherein the common line crosses the gate lines, partially overlaps with the gate lines, and the common line and the pixel electrodes partially overlap, forming three storage capacitors, respectively;
        wherein the common line comprises a first common section disposed along the second direction and a plurality of second common extension parts coupled to the first common section to form three closed patterns substantially surrounding the three sub-pixel regions, and the common line and the data line are made of a same conductive layer;
a second substrate disposed opposite to the first substrate; and
a liquid crystal layer interposed between the first substrate and the second substrate.

9. The liquid crystal display panel of claim 8, wherein the second common extension part and the gate line partially are overlapped, and the second common extension part comprises an opening pattern partially exposing the gate line.

10. A pixel structure of a display panel formed on a substrate, the substrate comprising a plurality of sub-pixel regions, the pixel structure comprising:
a gate line disposed along a first direction on the substrate;
a data line disposed along a second direction on the substrate;
a thin film transistor disposed in the sub-pixel region, the thin film transistor comprising a gate electrode, a source electrode and a drain electrode, wherein the gate electrode of the thin film transistor is electrically connected to the gate line, and the source electrode of the thin film transistor is electrically connected to the data line;
a pixel electrode disposed in the sub-pixel region and electrically connected to the drain electrode of the thin film transistor; and
a common line disposed on the substrate and partially overlapping with the gate line, wherein the common line and the pixel electrode partially overlap, forming a storage capacitor, wherein the common line comprises a first common section disposed along the second direction and at least a second common extension part coupled to the first common section to form a closed pattern substantially surrounding the sub-pixel region, and the common line and the data line are made of a same conductive layer.

11. The pixel structure of the display panel of claim 10, wherein the common line and the gate line are made of different conductive layers.

12. The pixel structure of the display panel of claim 10, wherein the second common extension part and the gate line partially are overlapped, and the second common extension part comprises an opening pattern partially exposing the gate line.

* * * * *